United States Patent
Kim

(10) Patent No.: US 8,194,800 B2
(45) Date of Patent: *Jun. 5, 2012

(54) REDUCING EQUALIZER ERROR PROPAGATION WITH A LOW COMPLEXITY SOFT OUTPUT VITERBI DECODER

(75) Inventor: Jin Hong Kim, Lake Zurich, IL (US)

(73) Assignee: Intersil Americas Inc, Milpitas, CA (US)

( * ) Notice: Subject to any disclaimer, the term of this patent is extended or adjusted under 35 U.S.C. 154(b) by 166 days.

This patent is subject to a terminal disclaimer.

(21) Appl. No.: 12/758,670

(22) Filed: Apr. 12, 2010

(65) Prior Publication Data

US 2010/0260267 A1    Oct. 14, 2010

Related U.S. Application Data

(63) Continuation of application No. 11/405,349, filed on Apr. 17, 2006, now Pat. No. 7,697,642.

(51) Int. Cl.
*H04L 27/06* (2006.01)
*H04M 13/03* (2006.01)

(52) U.S. Cl. ........................ 375/341; 714/795

(58) Field of Classification Search .......... 375/229–230, 375/233, 262, 285, 340–341; 714/794–795
See application file for complete search history.

(56) References Cited

U.S. PATENT DOCUMENTS

| | | | |
|---|---|---|---|
| 4,833,693 A | 5/1989 | Eyuboglu | |
| 5,583,889 A | 12/1996 | Citta et al. | |
| 5,600,677 A | 2/1997 | Citta et al. | |
| 5,604,769 A | 2/1997 | Wang | |
| 5,757,855 A | 5/1998 | Strolle et al. | |
| 5,933,462 A | 8/1999 | Viterbi et al. | |
| 6,012,161 A | 1/2000 | Ariyavisitakul et al. | |
| 6,052,821 A | 4/2000 | Chouly et al. | |
| 6,088,405 A | 7/2000 | Hladik et al. | |
| 6,173,011 B1 | 1/2001 | Rey et al. | |
| 6,587,521 B1* | 7/2003 | Matui | 375/341 |
| 6,591,395 B1 | 7/2003 | Tsai | |
| 6,651,215 B2 | 11/2003 | Miyauchi et al. | |
| 6,671,849 B2 | 12/2003 | Tripathi et al. | |
| 6,707,850 B1* | 3/2004 | Blake et al. | 375/233 |
| 6,819,630 B1 | 11/2004 | Blackmon et al. | |
| 7,139,312 B2 | 11/2006 | Graumann | |
| 7,697,642 B2* | 4/2010 | Kim | 375/341 |

(Continued)

OTHER PUBLICATIONS

Forney, G.D., et al., "The Viterbi Algorithm," IEEE, p. 268-278, (Mar. 1973).

Narayanan, K.R., et al., "Performance of Trellis-Coded CPM with Iterative Demodulation and Decoding," IEEE, p. 676-687, (Apr. 2001).

(Continued)

*Primary Examiner* — Khanh C Tran
(74) *Attorney, Agent, or Firm* — Arent Fox, LLP

(57) ABSTRACT

Novel systems and methods are described in which performance of equalizers can be improved by reducing the effects of error propagation in equalizers that use a Viterbi Decoder. Systems and methods of symbol correction in prediction decision feedback equalization architectures are described including systems and methods that include an enhanced Viterbi decoder and novel methods of symbol correction to obtain better system performance. The use of a blending algorithm is described to reduce errors in symbol decoding. Histories of deep trace back depth symbols can be maintained to enable more accurate decisions. Systems and methods described can provide advantage in the feedback path of adaptive equalizers in trellis decoders. The invention provides novel techniques for improving the performance of equalizers by reducing the effects of error propagation in equalizers that use a Viterbi Decoder.

19 Claims, 4 Drawing Sheets

U.S. PATENT DOCUMENTS

2002/0172275 A1 11/2002 Birru
2004/0057535 A1 3/2004 Strolle et al.
2005/0163209 A1 7/2005 Fimoff et al.
2006/0064628 A1 3/2006 Stein et al.

OTHER PUBLICATIONS

S.W. Heo, et al., "A Concatenated Equalizer/Trellis Decoder Architecture for a Terrestrial Digital Television Receiver," IEEE, p. 813-819, (Apr. 2004).

* cited by examiner

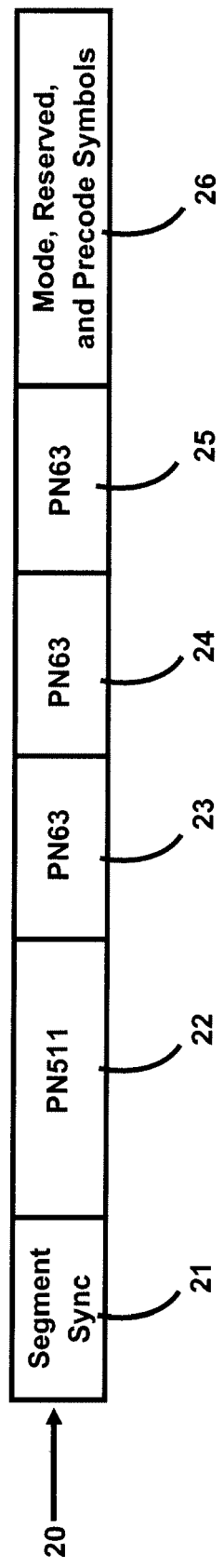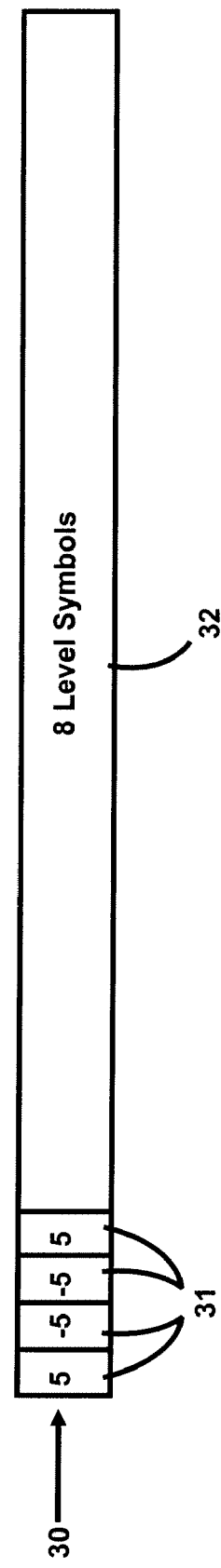
Fig. 2
Fig. 3

REDUCING EQUALIZER ERROR PROPAGATION WITH A LOW COMPLEXITY SOFT OUTPUT VITERBI DECODER

CROSS-REFERENCE TO RELATED APPLICATIONS

This application is a continuation of U.S. patent application Ser. No. 11/405,349, entitled "REDUCING EQUALIZER ERROR PROPAGATION WITH A LOW COMPLEXITY SOFT OUTPUT VITERBI DECODER" and filed on Apr. 17, 2006, (U.S. Pat. No. 7,697,642) and is related to U.S. patent application Ser. No. 11/405,352, entitled "DUAL PDFE SYSTEM WITH FORWARD-BACKWARD VITERBI" filed on Apr. 17, 2006, (U.S. Pat. No. 7,697,604), which applications are incorporated herein by reference and for all purposes.

BACKGROUND OF THE INVENTION

1. Field of the Invention

The present invention relates to decoding of trellis-encoded signals and more particularly to systems and methods of symbol correction in prediction decision feedback equalization architectures 2. Description of Related Art Since the adoption of the Advanced Television Systems Committee ("ATSC") digital television ("DTV") standard in 1996, there has been an ongoing effort to improve the design of receivers built for the ATSC DTV signal as described in the ATSC standard A/54 (see U.S. patent application publication 20050163209 for . . . ). Designers face major obstacles in designing receivers that might achieve good reception in the presence of multipath interference in the channel. Multipath interference affects the ability of the receiver to correctly decode transmitted symbols. Therefore, designers often add equalizers to receivers in order to cancel the effects of multipath interference and thereby improve signal reception.

Referring to FIG. 1, in the ATSC DTV transmission system, data is transmitted in frames 10. Each frame 10 is composed of 2 fields 11 and 12, each field 11 and 12 having 313 segments, and each segment having 832 symbols. The first four symbols in each segment are segment sync symbols 13 having the sequence [+5, −5, −5, +5]. The first segment in each field is a field sync segment 14 and 15.

Referring to figure shown in more detail in FIG. 2, field sync 20 comprises segment sync 21, a 511 symbol pseudo noise (PN511) sequence 22, a 63 symbol pseudo noise (PN63) sequence 23, a second PN63 sequence 24, a third PN63 sequence 25, and a 128 symbol sequence 26 composed of various mode, reserved, and precode symbols. The four PN sequences 22-25 are composed of symbols from the set {+5, −5}. In alternate fields, the three PN63 sequences 23-25 are the same. In the remaining fields, the first PN63 23 and third PN63 25 are the same while the second PN63 24 is inverted.

As shown in FIG. 3, subsequent 312 segments 30 of the field 11 and 12 (referred to as data segments) are structured such that 828 symbols 32 following the four segment sync symbols 31 are trellis encoded by a 12 phase trellis encoder described in detail in ATSC standard A/54. This results in 8 level symbols derived from the alphabet {−7 −5 −3 −1 +1 +3 +5 +7}.

Consider now an 8T-VSB transmitter such as is illustrated in FIG. 4. Input data 40 is first randomized 41, Reed-Solomon byte wise encoded 42, and then byte interleaved 43. Next the data is trellis encoded by a 12-phase trellis encoder 44. A multiplexer 45 adds the segment sync symbols and the field sync symbols to the trellis coded data at the appropriate times in the frame. Then, a pilot is inserted 46 by adding a DC level to the baseband signal and a modulator 47 modulates the resulting symbols to IF. Finally a RF upconverter 48 converts the signal for RF transmission as a vestigial sideband (VSB) signal at a symbol rate of 10.76 MHz.

Now consider a baseband model of the transmission channel fed by the above transmitter. The transmitted signal has a root raised cosine spectrum with a nominal bandwidth of 5.38 MHz and an excess bandwidth of 11.5% centered at one fourth of the symbol rate (i.e., 2.69 MHz). Thus the transmitted pulse shape q(t) is complex and given by $$q(t) = e^{j\pi F_s 1/2} q_{RRC}(t),$$

where $F_s$ is the symbol frequency, and $q_{RRC(t)}$ is a real square root raised cosine pulse with an excess bandwidth of 11.5% of the channel. The pulse q(t) is referred to as the "complex root raised cosine pulse". For the 8T-VSB system, the transmitter pulse shape q(t) and the receiver matched filter pulse shape q*(−t) are identical since q(t) is conjugate-symmetric. Thus the raised cosine pulse p(t), referred to as the "complex raised cosine pulse", is given by $$p(t) = q(t) * q^*(-t)$$

where * denotes convolution, and * denotes complex conjugation. The transmitted baseband signal of data rate 1/T symbols/sec can be represented as:

$$s(t) = \sum_k I_k q(t - kT),$$

$\{I_k \in A \equiv \{\alpha_1, \ldots \alpha_8\} \subset R^1\}$ is the transmitted data sequence, which is a discrete 8-ary sequence taking values on the real 8-ary alphabet A. The physical channel between the transmitter and receiver is denoted c(t) and can be described by:

$$c(t) = \sum_{k=-L_{ha}}^{L_{hc}} c_k \delta(t - \tau_k)$$

where $\{c_k(\tau)\} \subset C^1$, $L_{ha}$ and $L_{hc}$ are the number of maximum anti-casual and casual multipath delays, $\tau_k$ is multipath delay, and δ(t) is the Dirac delta function. Hence, the overall channel impulse response is $$h(t) = p(t) * c(t) = \sum_{-L_{ha}}^{L_{hc}} c_k p(t - \tau_k)$$

FIG. 5 shows an 8T-VSB receiver block diagram. A tuner 50 and IF filter 51 demodulate an RF signal to baseband. Next, timing and synchronization recovery is performed 52 along with the rejection of any NTSC interference 53. The data is then equalized 54 and sent through a phase tracker 55 and trellis decoded 56, de-interleaved 57, Reed-Solomon decoded 58, and finally de-randomized 59. The matched filter output y(t) in the receiver prior to equalization is:

$$y(t) = \left(\sum_k \delta(t - kT)\right) * h(t) + v(t),$$

where $$v(t) = \eta(t) * q^*(-t)$$

denotes the complex (colored) noise process after the pulse matched filter, with η(t) being a zero-mean white Gaussian noise process with spectral density $\sigma_n^2$ per real and imaginary part. Sampling the matched filter output y(t) at the symbol rate produces the discrete time representation of the overall communication system according to the following equation:

$$y[n]=y(t)|_{t=nT}=\Sigma I_k h[n-k]+v[n]$$

Broadcast television channels are a relatively severe multipath environment due to a variety of conditions encountered in the channel and at the receiver. Only 728 symbols of a VSB field sync segment are known a priori and can be used as a training sequence for an adaptive equalizer. The channel is not known a priori, so the equalizer in the receiver must be able to adaptively identify and combat the various channel conditions. Since multipath signals in the broadcast channel may arrive many symbols after the main signal, the decision feedback equalizer (DFE) is invariably used in 8T-VSB applications. Another DFE structure that is well known is the noise predictive decision feedback equalizer (pDFE). Although both DFEs and pDFEs are good at combating multipath channels, both have the problem of error propagation. Error propagation occurs when there are errors in the feedback path. This, in turn, feeds erroneous data into the decision device resulting in incorrect symbol decisions. For 8T-VSB applications, the most commonly used decision device is the Viterbi Decoder. Therefore it is important to mitigate the effects of error propagation.

Since the 8T-VSB symbols are convolutionally coded, they may be decoded in the receiver with a Viterbi decoder [ATSC Standard A/54, U.S. Pat. Nos. 5,600,677, 5,583,889]. The Viterbi Algorithm (VA) for maximum likelihood sequence estimation of transmitted symbols corrupted by white noise is very well known (see "The Viterbi Algorithm", G. D. Forney, Jr., Proc. IEEE, vol. 61, pp. 268-278, March 1973, "Digital Communications—Fundamentals and Applications", Bernard Sklar, Prentice-Hall, 1988). The decoder may equivalently provide estimates of the encoded bit pairs or estimates of the mapped 8 level symbols, the later being utilized in the context of an equalizer. As is well known, the VA requires a path history memory for each state and involves add, compare, select operations based on trellis path metrics determined from sums of Euclidean distance branch metrics. As time advances, the most likely trellis paths (as indicated by the lowest path metrics) into each state of the trellis are saved, the rest are discarded. If the decoding algorithm searches back sufficiently deep in the trellis path memory, the result of discarding less likely paths—leaving only survivor paths—is a single surviving branch which defines the most likely symbol (hard symbol decision) at that prior point in time. At shallower path memory trace back depths (closer to the present time), there is a higher likelihood of multiple surviving branches with symbol probabilities proportional to the corresponding path metrics.

BRIEF SUMMARY OF THE INVENTION

The present invention provides a novel technique for improving the performance of equalizers by reducing the effects of error propagation in equalizers that use a Viterbi Decoder. Systems and methods of symbol correction in prediction decision feedback equalization ("pDFE") architectures are provided. Particularly, embodiments of the invention are described that include an enhanced Viterbi decoder and novel methods of symbol correction to obtain better system performance. The use of a blending algorithm is described to reduce errors in symbol decoding.

The Viterbi Algorithm ("VA") can be described as follows for an S state trellis with a path memory of length M for each state that holds a sequence of state transitions and associated branch metrics:

At each time increment n.
For each trellis state k.
Calculate the Euclidean branch metric for each branch into state k from all possible prior states at time (n−1).
Add the above branch metrics to the associated path metrics for each possible prior state at time (n−1).
Choose the path into state k at time n with the best path metric and store it in the path memory associated with state k (overwriting the previous stored path).
Decode symbol.
Examine path memory back to time (n−M); if M is large enough, the path memories for each of the S states will show the same state transition at time (n−M) and hence indicate the same symbol; choose that symbol as the hard decision.
If the state transitions for time (n−M) are not the same, choose the state transition (and hence the symbol) corresponding to the path that has the best path metric from time (n−M) to time n.

Instead of outputting a single symbol decision delayed by M, the decoder can output a M+1 long vector of symbol decisions with delays ranging from zero (corresponding to time n) to M as follows. For each time increment n, the Viterbi decoder updates the metrics and returns a vector of symbols whose length is M+1, where M is referred to as the trace back depth. As described above, the deep trace back depth symbol decisions will be more accurate than the shallow trace back depth symbols.

As will be explained in more detail below, trellis decoders may use this advantage in the feedback path of an adaptive equalizer. For a given time n, it can be beneficial to update all M+1 symbols in the equalizer feedback path such that M trace back depth symbols can overwrite M previously decoded symbols in the feedback path, thereby updating symbol decisions for times (n−M) through n. Such updating of more accurate symbols can facilitate a reduction in error propagation in the equalizer feedback path. Consequently, the present invention provides novel techniques for improving the performance of equalizers by reducing the effects of error propagation in equalizers that use a Viterbi Decoder.

The foregoing and other aspects of various embodiments of the present invention will be apparent through examination of the following detailed description thereof in conjunction with the accompanying drawings.

BRIEF DESCRIPTION OF THE DRAWINGS

The present invention is illustrated by way of example, and not limitation, in the figures of the accompanying drawings in which like references denote similar elements, and in which:

FIG. 2 depicts a field sync segment in a frame in an ATSC DTV transmission system;

FIG. 3 depicts a data segment in a frame in an ATSC DTV transmission system;

DETAILED DESCRIPTION OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention. Wherever convenient, the same reference numbers will be used throughout the drawings to refer to same or like parts. Where certain elements of these embodiments can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Certain embodiments provide systems and methods of symbol correction in prediction decision feedback equalization ("pDFE") architectures. Certain of the methods and systems described can also be applied to conventional decision feedback equalization ("DFE") architectures.

Figure 1:
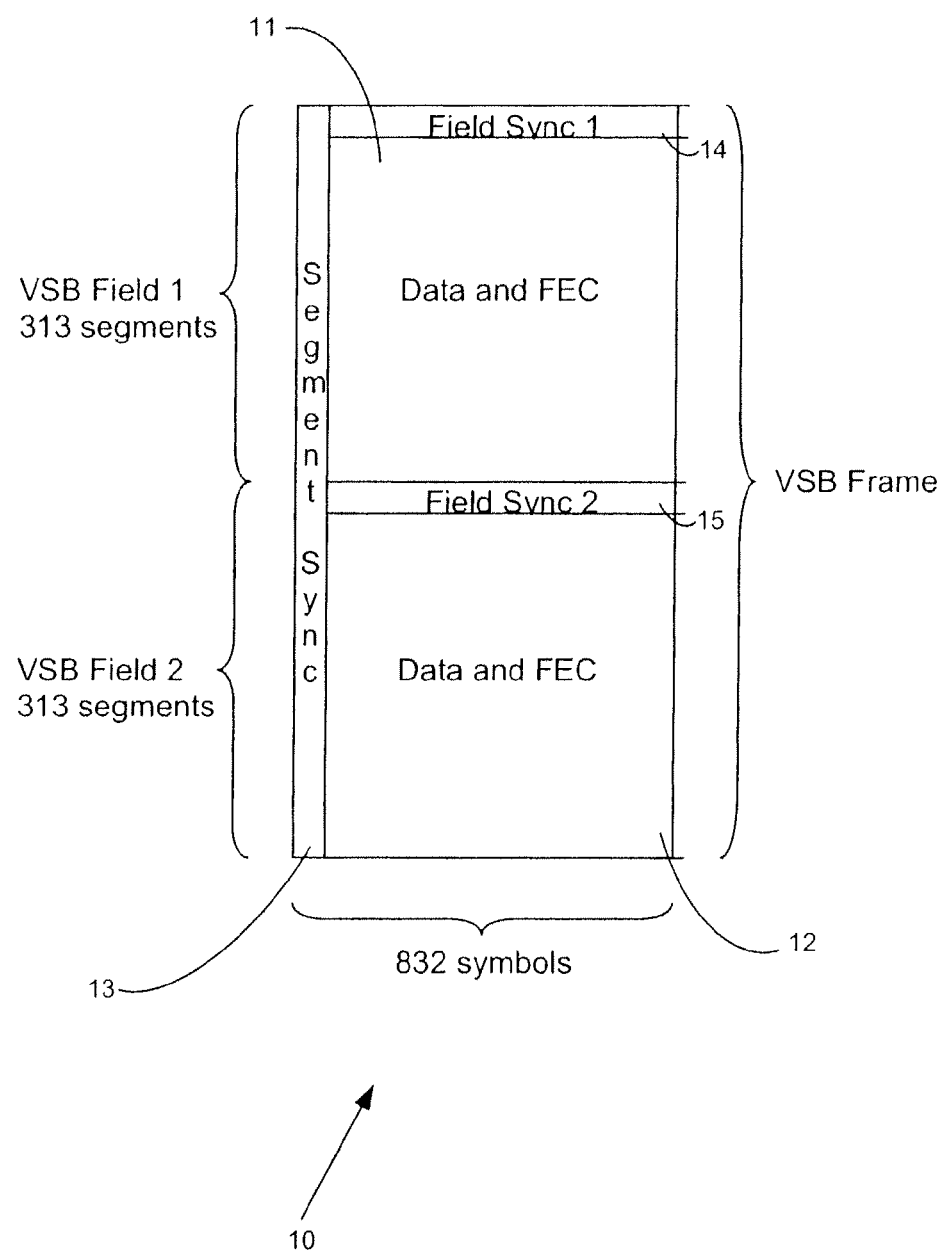
FIG. 1 depicts a frame in an ATSC DTV transmission system.
Figures 4, 5:
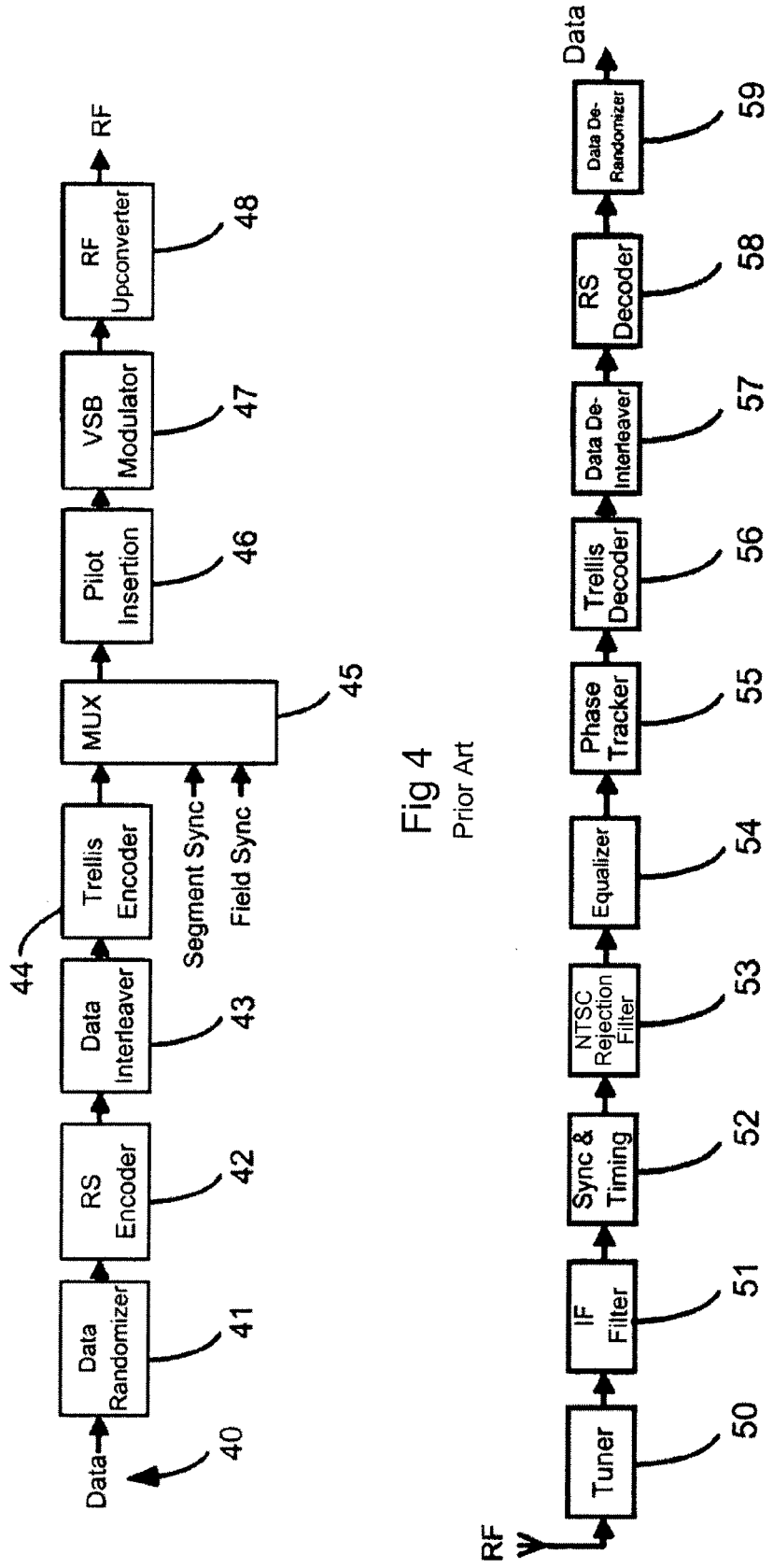
FIG. 4. illustrates an 8T-VSB transmitter.
FIG. 5 shows an 8T-VSB receiver block diagram.
Figure 6:
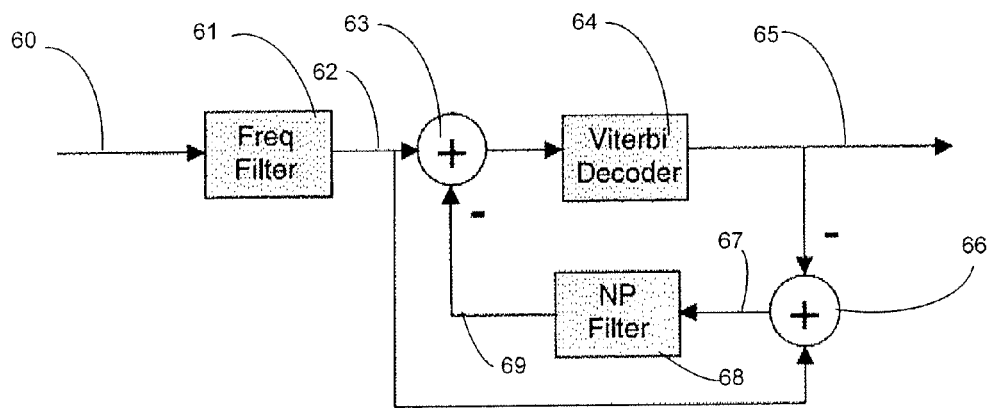
FIG. 6 illustrates prediction decision feedback equalization as included in certain embodiments of the invention.

Referring to FIG. 6, an example of a pDFE architecture is illustrated. A feed forward filter 61 performs block based frequency domain filtering on data received at an input 60. Summing element 63 adds output 62 from input filter 61 to output 69 from feedback filter 68. The summed output is then provided to Viterbi decoder 64. Viterbi decoder 64 provides the pDFE output 65. Typically, frequency domain filter 61 is block based and output 65 consequently comprises a block of symbols. Output 65 is then added to input filter output 62 using summer 66 to provide an input 67 to feedback filter 68. Feedback filter 68 can include a noise predictor (not shown). The noise predictor in the feedback loop can estimate colored (non-white) noise from error signal 67. Adder 63 may then subtract the estimated colored noise from the equalized data, thereby helping Viterbi decoder 64 to make better decisions.

In certain embodiments, Viterbi Decoder 64 can store metrics for a plurality of states including a smallest metric obtained, a previous state, and a current state. As discussed above, the metrics are typically used to configure or adjust a Viterbi algorithm that requires a path history memory for each state. The metrics can be based on trellis path metrics determined from sums of Euclidean distance branch metrics. The condition of the plurality of stored metrics is used to determine which symbol is decoded. If a delay is incurred, Viterbi Decoder 64 may be able to correct some symbols using trace back depth decoding.

Figure 7:
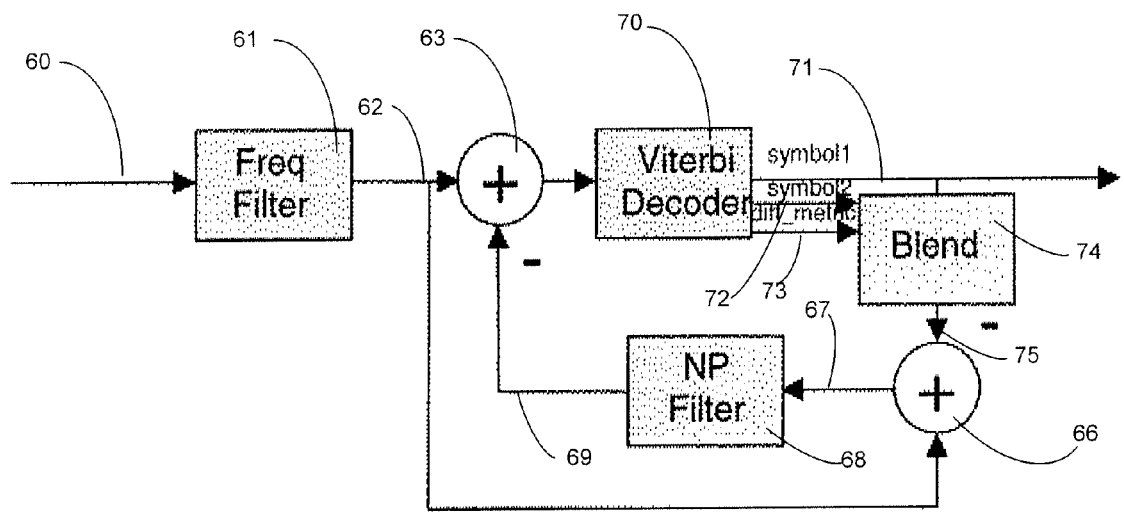
FIG. 7 is an example of a system according to one embodiment of the invention.

Referring now to FIG. 7, embodiments of the invention include an enhanced Viterbi Decoder 70 as a decision device coupled with a novel method of symbol correction that can deliver better system performance. In certain embodiments a Viterbi algorithm operates on an S state trellis with a path memory of length M for each state that holds a sequence of state transitions and associated branch metrics and can output an M+1 long vector of symbol decisions with delays ranging from zero (corresponding to time n) to M as follows. For each time increment n, the Viterbi decoder may update the metrics and return a vector of symbols whose length is M+1, where M is referred to as the trace back depth. Deep trace back depth symbol decisions can be more accurate than shallow trace back depth symbols.

In certain embodiments, Viterbi Decoder 70 can determine metrics associated with potential decoding paths wherein the metrics can be used to assess reliability of decoded symbols. Viterbi Decoder 70 can output a first vector 71 representing the most likely decoded symbols. The most likely symbols are typically determined by considering trace back depth decoding. Additionally, Viterbi Decoder 70 can output a second vector 72 representing second most likely decoded symbols and a difference metric ("diff_metric") 73 quantifying a difference in estimated reliability of first vector 71 and second vector 72. Diff_metric 73 can be used to ascertain the reliability of a trellis decoded symbol such that a large diff_metric 73 value may indicate reliability of decoded symbols while small a diff_metric 73 value can be indicative of decoded symbols that are unreliable. In certain embodiments, a blender 74 can apply a blending algorithm on first vector 71 and second vector 72 based on the diff_metric 73. Having received decoded symbols from Viterbi Decoder 70, blender 74 can blend the decoded symbols with long delayed trellis symbols from Viterbi Decoder 70.

More particularly, diff_metric 73 is a measure of reliability that can be calculated as the difference of the two smallest surviving path metrics. For deep trace back depth symbols, the corresponding symbols of first vector 71 and second vector 72 can often be identical, indicating that a single surviving path exists at that point. However, for shallow trace back depth symbols, it is more likely that the corresponding symbols from first vector 71 and second vector 72 will be different, indicating that multiple surviving paths exist at that point. Path metrics can be calculated that indicate variances of the decoded path from a measured signal path and it will be appreciated that a smallest path metric typically indicates the most probable path. However, where multiple surviving paths exist, the smallest metric surviving path may generate errors in the decoded symbols. Diff_metric 73 can quantify the probability of errors by indicating the difference in path metrics between most likely surviving paths. In the example of FIG. 7, diff_metric 73 is calculated as the difference in path metrics between first vector 71 and second vector 72.

In certain embodiments, diff_metric 73 is used to assess the reliability of first vector 71. A large diff_metric may be interpreted as an indication that the decoded symbols are reliable. On the other hand, a small diff_metric may be interpreted as an indication that the decoded symbols are unreliable. This reliability information can be provided to blender 74 for executing a blending algorithm on first vector 71 and second vector 72. The blending algorithm may apply weighting factors based on one or more successive diff-metric 73 values to generate error compensation in the pDFE of FIG. 7.

Referring to Table 1, an example may better illustrate weighting as employed by blender 74 in certain embodiments. Taking a scalar weighting factor a as weight for the most likely path while the scalar weighting factor b weights the second most likely path. Then a and b can be selected depending on the value of diff_metric 73 as shown in Table 1.

TABLE 1

|   | diff_metric <= 1.0 | 1.0 < diff_metric <= 2.0 | 2.0 < diff_metric <= 3.0 | 3.0 < diff_metric |
|---|---|---|---|---|
| a | 0.5 | 0.625 | 0.75 | 1.0 |
| b | 0.5 | 0.375 | 0.25 | 0.0 |

Consider another example in which a trace back depth of 8 is assumed. Where the symbols for the most likely path of a Viterbi Decoder are [−5 1 3 5 1 −3 3 −3 −7], the symbols for the second most likely path of that same Viterbi Decoder are [−7 −1 3 3 −1 1 3 −3 −7] and the corresponding diff_metric 73 is 2.6. Then, according to Table 1 above, the weighting factors are a=0.75 and b=0.25. In this example the resulting new trace back depth decoded vector would be:

0.75*[−5 1 3 5 1 −3 3 −3 −7]+0.25*
[−7 −1 3 3 −1 1 3 −3 −7]=[−5.5 0.5 3.0 4.5 0.5 −2.0 3.0 −3.0 −7.0].

This new "soft" vector can then be used in the feedback path 67-69 of FIG. 7 instead of the most likely path vector 71. Consequently, is able to more accurately predict the noise and improve the performance of the pDFE.

In many embodiments, implementation of the described methods of decoding symbols can require little additional hardware. For example, the Viterbi Decoder block may be implemented using an additional M+1 memory units for storing second trace back depth symbols, where M represents the trace back depth. An adder may also be needed to calculate the diff_metric. For the Blend block, three comparators, 8 preset taps (for a and b), 2M multipliers and M adders may be needed.

Simulations have been performed using the example depicted in FIG. 7, with the criterion of SER<=0.0050 for a trace back depth of 16. Six different channels were tested. In comparison to the pDFE system in FIG. 6, the pDFE in FIG. 7 performs better. For Brazil A, there is a 0.1 dB improvement (signal-to-noise ratio "SNR" input can be 0.1 dB less). Brazil B shows a 0.2 dB improvement, Brazil C shows a 0.7 dB improvement, Brazil D shows a 0.4 dB improvement and Brazil E shows a 0.9 dB improvement. This improvement incurs a minor cost in hardware.

It will be appreciated that the Brazil channels A-E are difficult multipath channels used for reference testing. They include ghosts of varying delays and amplitudes. They are referenced in Interferencia por Multipercurso—Simulacao De Canais Tipo: "Rice", "Rayleigh", Harbour Apartment" E "SNF", SET-ABERT, Feb. 11, 1999.

It is apparent that the above embodiments may be altered in many ways without departing from the scope of the invention. Further, various aspects of a particular embodiment may contain patentably subject matter without regard to other aspects of the same embodiment. Additionally, various aspects of different embodiments can be combined together. Also, those skilled in the art will understand that variations can be made in the number and arrangement of components illustrated in the above diagrams. It is intended that the appended claims include such changes and modifications.

What is claimed is:

1. A method comprising the steps of:
   providing a signal to a Viterbi decoder;
   receiving from the Viterbi Decoder a first vector representative of first decoded symbols and a second vector of second decoded symbols, the first vector and second vector being associated with corresponding measurements of reliability of the first and second decoded symbols;
   blending selected symbols associated with the second vector with symbols associated with the first vector to obtain an output vector; and
   providing feedback to the Viterbi decoder based on the first vector, the second vector and the corresponding measurements of reliability.

2. The method of claim 1, wherein the step of blending is based on reliability measurements.

3. The method of claim 1, and further comprising calculating a difference metric representative of reliability of the output.

4. The method of claim 3, wherein the difference metric is based on information including a history of previously decoded symbols.

5. The method of claim 4, wherein the feedback is further based on the difference metric.

6. The method of claim 4, wherein the feedback includes a trace back depth decoded vector.

7. The method of claim 3, wherein the corresponding measurements of reliability are used to generate a blending algorithm.

8. The method of claim 7, wherein the blending algorithm generates measurements by apply weighting factors based on one or more successive difference metrics.

9. A system for improving equalizer performance comprising:
   a Viterbi decoder for providing symbols and a corresponding difference metric;
   a blender for blending the decoded symbols with delayed trellis symbols from the Viterbi decoder based on the difference metric;
   a filter configured to provide a feedback signal to the Viterbi decoder, wherein
   the filter includes a noise predictor for generating an estimate of colored noise for adjusting operation of the Viterbi decoder.

10. A system according to claim 9, wherein the symbols include a first vector representing most likely decoded symbols and a second vector representing second most likely decoded symbols.

11. A system according to claim 10, wherein the most likely symbols are determined from trace back depth decoding.

12. A system according to claim 11, wherein the difference metric is calculated as difference of two smallest surviving path metrics.

13. A system according to claim 10, wherein the trace back depth decoding employs trellis path metrics maintained by the Viterbi decoder.

14. A system according to claim 13, wherein the trellis path metrics are determined from sums of Euclidean distance branch metrics.

15. An equalizer comprising:
   a Viterbi decoder configured to receive a filtered input signal added to a feedback signal and adapted to provide two outputs representing likely decoded symbols and a difference metric quantifying differences in estimated reliabilities of the two outputs;
   a blender adapted to blend the likely decoded symbols with delayed trellis symbols provided by the Viterbi decoder, wherein blending is based on the difference metric; and
   a feedback filter adapted to estimate colored noise in an error signal received from the blender and further adapted to generate the feedback signal.

16. The equalizer of claim 15, wherein the feedback filter includes a noise predictor configured to estimate the colored noise.

17. The equalizer of claim 15, wherein the two outputs includes an output signal representative of most likely decoded symbols.

18. The equalizer of claim 17, wherein the most likely decoded symbols are determined based on trace trellis path metrics maintained by the Viterbi decoder.

19. The equalizer of claim 15, and further comprising a block based frequency domain filter adapted to filter an input signal to provide the filtered input signal.

* * * * *